(12) United States Patent
Doty

(10) Patent No.: US 7,196,521 B2
(45) Date of Patent: Mar. 27, 2007

(54) NMR MAS ELECTRET SPIN RATE DETECTION

(75) Inventor: F David Doty, Columbia, SC (US)

(73) Assignee: Doty Scientific, Inc., Columbia, SC (US)

( * ) Notice: Subject to any disclaimer, the term of this patent is extended or adjusted under 35 U.S.C. 154(b) by 0 days.

(21) Appl. No.: 11/276,821

(22) Filed: Mar. 15, 2006

(65) Prior Publication Data
US 2006/0220647 A1 Oct. 5, 2006

Related U.S. Application Data

(60) Provisional application No. 60/594,326, filed on Mar. 29, 2005.

(51) Int. Cl.
*G01V 3/00* (2006.01)
(52) U.S. Cl. .................. 324/321; 324/318
(58) Field of Classification Search ............ 324/321, 324/318, 322
See application file for complete search history.

(56) References Cited

U.S. PATENT DOCUMENTS

| | | | |
|---|---|---|---|
| 4,275,350 A | 6/1981 | Hill | |
| 4,446,430 A | 5/1984 | Stejskal | |
| 4,456,882 A | 6/1984 | Doty | |
| 4,739,270 A | 4/1988 | Daugaard | |
| 5,099,206 A * | 3/1992 | Imaizumi et al. | ........... 324/307 |
| 5,170,120 A | 12/1992 | Barbara | |
| 5,202,633 A | 4/1993 | Doty | |
| 5,729,142 A * | 3/1998 | Baltusis | ....................... 324/321 |
| 6,130,537 A | 10/2000 | Doty | |
| 6,198,284 B1 | 3/2001 | Doty | |
| 6,367,326 B1 * | 4/2002 | Okada | ..................... 73/504.12 |
| 6,803,764 B2 | 10/2004 | Hioka | |
| 6,818,092 B2 | 11/2004 | Cho | |

OTHER PUBLICATIONS

"Electret Sensors, Filters, and MEMS Devices" by Malti Goel, in Current Science, vol. 85, #4, Aug. 25, 2003, pp. 443-453.

* cited by examiner

*Primary Examiner*—Louis M. Arana
(74) *Attorney, Agent, or Firm*—Oppedahl Patent Law Firm LLC

(57) ABSTRACT

A material having a permanent external diametrical electric field is included within an NMR MAS spinner. Such materials include ferroelectret porous films, in which the electric polarization arises from opposite mono-polar charges on separated surfaces within a structured material containing voids. Rotation of electrically polarized material produces a time-dependent electric field, modulated at the rotational frequency, so that a simple antenna achieves high sensitivity and phase stability in spin rate detection. The electrically polarized material is also of sufficiently high resistivity that modulation of the external NMR polarizing magnetic field $B_0$ is negligible.

12 Claims, 2 Drawing Sheets

000
NMR MAS ELECTRET SPIN RATE DETECTION

CROSS-REFERENCE TO RELATED APPLICATIONS

This application claims priority from U.S. application No. 60/594,326, filed Mar. 29, 2005, which application is hereby incorporated herein by reference for all purposes.

FIELD OF THE INVENTION

The field of this invention is high-speed cylindrical sample spinners for Nuclear Magnetic Resonance (NMR) Magic Angle Spinning (MAS).

BACKGROUND OF THE INVENTION

A large number of techniques have been developed to improve the spectral resolution in Nuclear Magnetic Resonance (NMR) of solid samples, and most modern techniques include extremely rapid spinning (10–30 kHz) of the sample at the "Magic Angle" (the zero of the second Legendre polynomial, 54.7°) with respect to $B_0$. If the rotational rate is fast compared to chemical shift anisotropies and dipolar couplings (in units of Hz), the resolution is dramatically improved—often by two or three orders of magnitude. Even when the spinning is not fast enough to satisfy the above conditions, substantial improvements in resolution are generally obtained from the combination of MAS and multiple-pulse methods. MAS NMR spinners of several types have been disclosed, for example, in U.S. Pat. Nos. 4,275,350, 4,446,430, 4,456,882, 4,739,270, 5,202,633 and 6,803,764.

The MAS spinner is but one component of the NMR MAS probe or probe head, which is inserted into the bore of a superconducting high-field, high-homogeneity magnet. The other primary components of the probe include the rf tuning circuitry, an example of which is disclosed in U.S. Pat. No. 6,130,537, and temperature control means, according to the prior art.

This invention pertains specifically to a novel method of spin-rate detection. Three methods have been widely used for the past three decades—acoustic, triboelectric, and optical. Barbara, in U.S. Pat. No. 5,170,120 discloses an MAS technique that depends critically on synchronous pulsing and hence spin-rate detection with good phase accuracy and stability. Many other MAS techniques also require pulsing synchronously with the spinning; and for this reason, most modern MAS NMR probes rely on optical spin rate detection. Under proper conditions, they may achieve rotational phase accuracy of a few degrees over a range of rotational rates from tens of Hertz to over 20 kHz.

One of the earliest spin-rate detection methods involved mounting an electret-based, non-magnetic microphone about 30 cm from the spinner and amplifying and filtering the signal. The problem with this method is that the acoustic signal strength at the fundamental frequency from a well-balanced rotor is generally too low for adequate phase stability of the detection, even with sophisticated filtering.

The conventional triboelectric method relies on the asymmetrical build up of surface charges on the ceramic rotor surface from the high-velocity bearing gases flowing over it. This random and hence asymmetrical spinning surface charge produces a modulated electric field that may be detected by a small, high-impedance, dipole antenna. Of course, relying on a random process makes phase accuracy impossible, and the signal strength often drops below the noise level. Also, the harmonic content of the signal is unpredictable. Still, this method is often used, as it is simple to implement, while the optical method is not always as easy to implement as one might suppose.

The challenges of implementing optical spin rate detection arise predominately from the fact that space is extremely precious near the spinning sample, as every bit is needed to optimize both the rf coils and the spinner system. Moreover, the light pipes must be quite small if they come very close to the sample region to avoid unacceptable perturbation of the magnetic field homogeneity, either as a result of their own susceptibility or as a result of requiring a window in the spinner stator, which is generally diamagnetic. Small light pipes are fragile, and it has often been difficult to achieve adequate S/N in the optical signal for the desired phase accuracy.

The challenges of implementing optical spin rate detection appear to increase by an order of magnitude in the case of a CryoMAS™ probe, where a ceramic dewar is required between the sample rotor and the rf coils. In other cases too, including Switched Angle Spinning (SAS), as discussed in more detail in U.S. Pat. No. 6,198,284, and in spinners compatible with automatic sample change in narrow bore magnets, as discussed in more detail in co-pending application Ser. No. 11/163,344 filed Oct. 14, 2005 on MAS Inflow Bernoulli Bearings, now published as US publication number [to be provided upon publication], which co-pending application is hereby incorporated herein by reference for all purposes, a more practical method of spin rate detection with high phase stability is needed.

U.S. Pat. No. 6,803,764 claims the use of a gold film, deposited on the rotor, for reflection of the optical spin-rate detection signal, where the gold film is sufficiently thin to prevent it from coming off from the high centrifugal forces. It is not clear that the gold film can be made thin enough to prevent eddy current problems in very high fields and still be thick enough to be a good reflector of light. It is instructive to note that turbines with number of blades prime to the number of nozzles, as cited in the independent claim in this patent, were in the Doty Scientific 4 mm production model XC4 in 1998, and those 4 mm rotors routinely spin at 25 kHz.

The instant invention utilizes a material within the spinner (herein referring to the combination of the ceramic rotor tube, its end caps, and the sample) having a permanent net electric field. Such materials include ferroelectret films, in which the electric polarization generally arises from opposite mono-polar charges on separated surfaces within a structured material containing voids, or from piezoelectric materials, also known as a ferroelectric materials (the name comes from analogy to permanent magnets), in which the electric polarization arises from a crystallize structure lacking an inversion center.

Rotation of electrically polarized material produces a time-dependent electric field, modulated at the rotational frequency, so that means similar to the conventional triboelectric method achieve the needed high sensitivity and phase stability. If the electrically polarized material is also of sufficiently high resistivity, modulation of the external NMR polarizing magnetic field $B_0$ will be negligible, as desired for NMR applications.

Piezoelectric materials have been widely utilized for at least six decades in microphones, and related electret film materials have been widely utilized for nearly four decades in microphones and other transducer applications. Over the past decade, there has been substantial progress in the production of porous polymeric ferroelectret film materials that have seen a wide range of sensor applications. See, for example, the publicly available paper "Electret Sensors, Filters, and MEMS Devices" by Malti Goel, in *Current Science*, Vol. 85, #4, 25th Aug., 2003, pp 443–453, or the information available at the web site of the company EMFIT, Ltd. A recent advance in the production of PTFE electret films is disclosed in U.S. Pat. No. 6,818,092. Generally, electret sensors require electrodes for connecting to an external circuit. An important characteristic of the instant invention is that the electrodes are preferably omitted, or a least of very high resistivity, so as to avoid deleterious eddy currents when rotating in a high external magnetic field.

SUMMARY OF THE INVENTION

A material having a permanent external diametrical electric field is included within an NMR MAS spinner. Such materials include ferroelectret porous films, in which the electric polarization arises from opposite mono-polar charges on separated surfaces within a structured material containing voids. Rotation of electrically polarized material produces a time-dependent electric field, modulated at the rotational frequency, so that a simple antenna achieves high sensitivity and phase stability in spin rate detection. The electrically polarized material is also of sufficiently high resistivity that modulation of the external NMR polarizing magnetic field $B_0$ is negligible.

DETAILED DESCRIPTION OF THE PREFERRED EMBODIMENT

Figure 1:
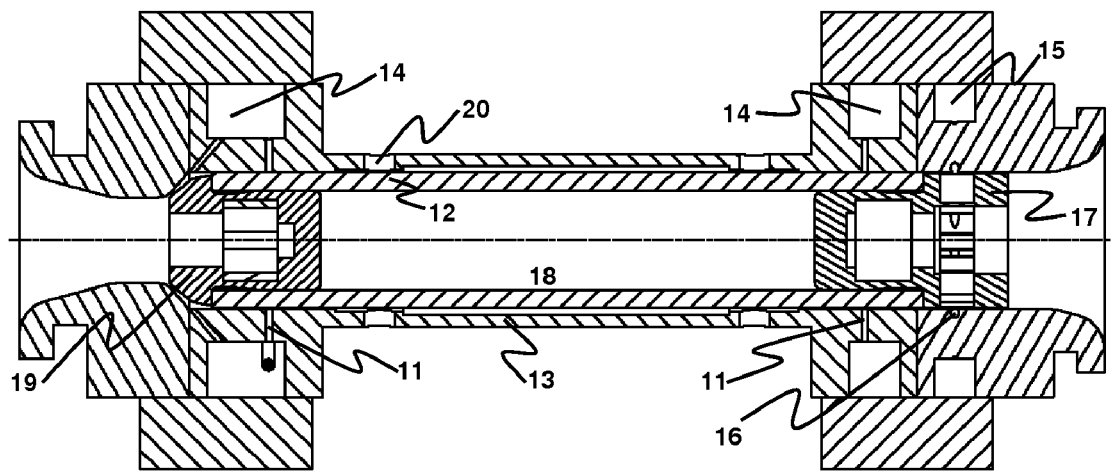
FIG. 1 is a longitudinal view of a representative MAS stator and rotor with a conical tip axial bearing cap at the lower end and a turbine drive cap at the upper end.

The representative high-speed NMR sample spinner shown in FIG. 1 is disclosed in more detail in the above-mentioned co-pending application Ser. No. 11/163,344. It has hydrostatic air radial bearing orifices 11 introducing pressurized gas radially to support the ceramic rotor 12 near both ends inside the ceramic cylindrical stator 13, according to the prior art. Bearing manifolds 14 are provided for distribution of air to the radial bearing orifices, and a drive manifold 15 is provided for distribution of air to the tangentially directed drive nozzles 16, which enable the microturbine 17 at the "top" or "front" of the rotor to spin the rotor 12 and its NMR sample 18. The axial bearing tip 19 is pressed into the "bottom" or "rear" of the rotor. Central bearing exhaust holes 20 are provided at axial locations somewhat closer to the middle of the stator than the bearing orifices, in regions where the cylindrical stator inside diameter is greater than in the immediate vicinity of the bearing orifices, according to the prior art. Also, one or more rf coils (not shown) surrounds the central region of the stator, according to the prior art.

Note that the spinner axis is normally oriented at 54.7° with respect to vertical during operation. Hence, the right side or "top" of FIG. 1 would be elevated with respect to the left side, and gravity would tend to maintain the rotor toward the conical axial bearing surface.

Figure 2:
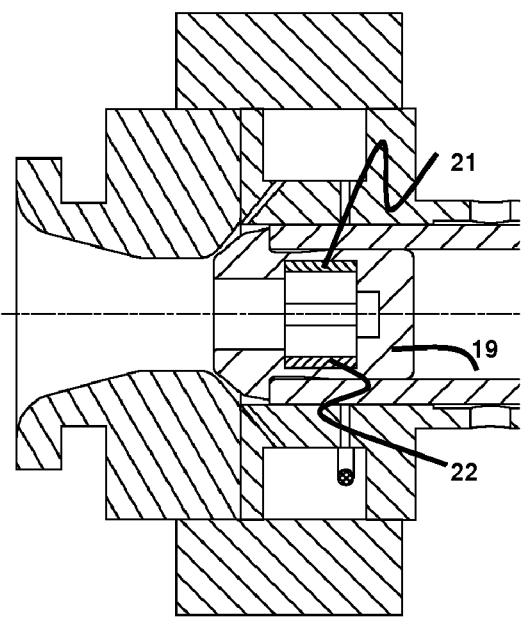
FIG. 2 is an enlargement of a longitudinal view of a cap containing electret material.
Figure 3:
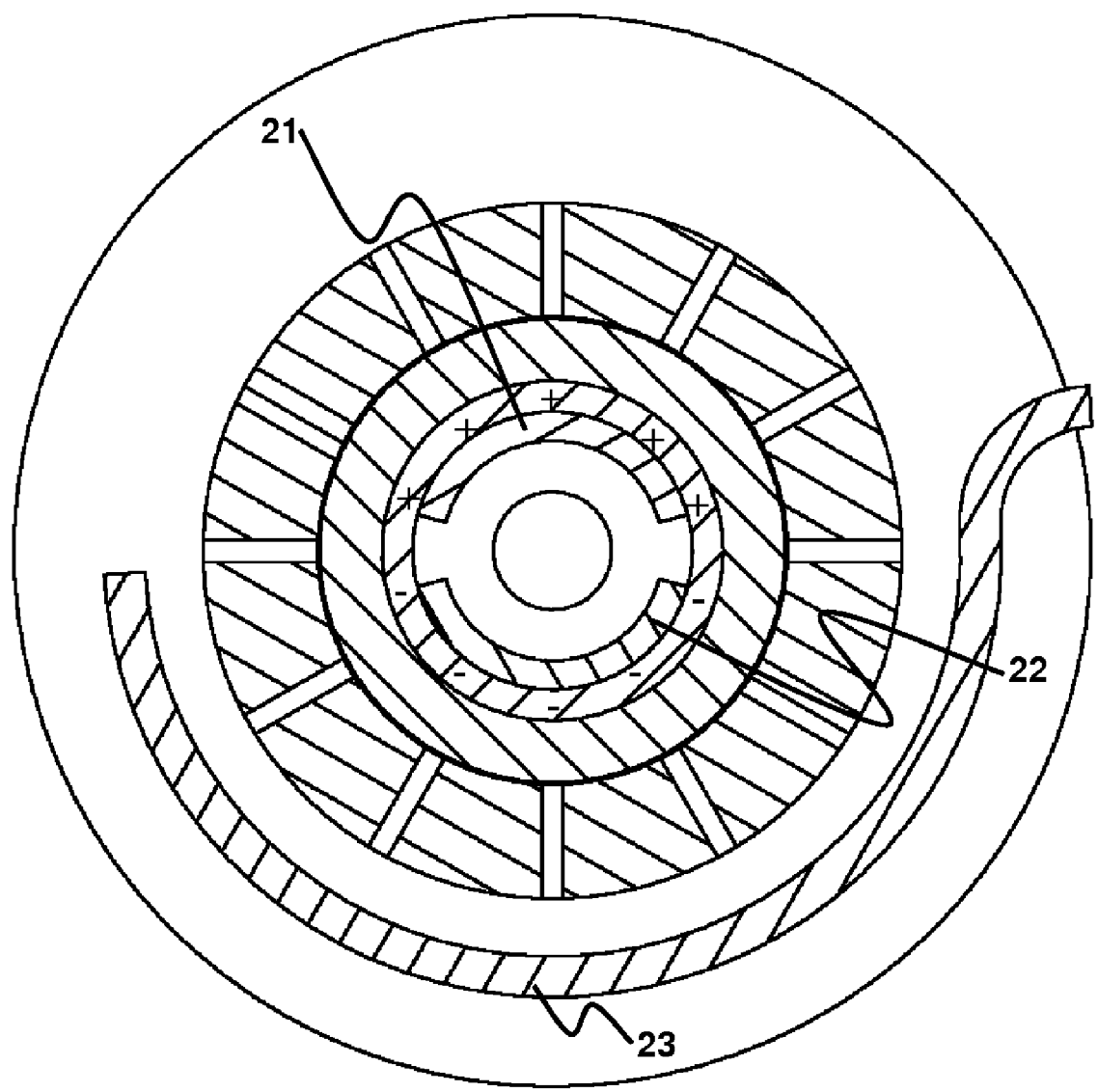
FIG. 3 is an axial view cross section of a specific embodiment.

Electrically polarized (also known as poled) material is included inside the spinner (rotor plus caps), preferably within one of the caps, or in a separate plug within the rotor, such that a permanent diametrical electric field is established. FIG. 2, in which the tip cap is shown in more detail, illustrates a particular embodiment. Here, two short pieces of poled, porous, electret film 21, 22 without electrodes, each subtending less than 180° of the circumference, are laid oppositely inside a groove in the tip cap. The two electrets are oriented such that one presents its negative surface to the outside and the other presents its positive surface to the outside, as depicted in FIG. 3. The strength of the signal may be increased by adding multiple layers of electret material oriented such that their E fields add. An antenna wire 23 is positioned within the stator close to the axial location of the electret material within the spinner, and the voltage induced on the wire is processed as in the prior art. In an exemplary embodiment, the end cap is made of a non-magnetic, non-conductive material having yield strength greater than 20 MPa.

Although this invention has been described herein with reference to specific embodiments, it will be recognized that changes and modifications may be made without departing from the spirit of the present invention. All such modifications and changes are intended to be included within the scope of the following claims.

I claim:

1. An NMR MAS probe comprising:
    a sample spinner supported radially by a plurality of radial bearing orifices near each end and rotationally driven by gas drive means, thereby defining a rotational axis of said spinner,
    an electrically polarized material within said spinner having a permanent electric field component in a direction transverse to the rotational axis of said spinner,
    antenna means for detecting a time-dependent electric field produced by rotation of said electrically polarized material.

2. The probe of claim 1 in which said polarized material is a porous polymeric electret film without electrodes.

3. The probe of claim 1 in which said polarized material is comprised of multiple pieces of electret film symmetrically distributed and oriented such that their respective E fields add.

4. A cylindrical sample spinner, the cylindrical sample spinner defining a rotation axis of said spinner,
    an electrically polarized material within said spinner having a permanent electric field component in a direction transverse to the rotational axis of said spinner.

5. The spinner of claim 4 in which said polarized material is a porous polymeric electret film without electrodes.

6. The spinner of claim 4 in which said polarized material is comprised of multiple pieces of electret film symmetrically distributed and oriented such that their respective E fields add.

7. An end cap for a cylindrical sample spinner, the end cap defining a rotation axis,
    an electrically polarized material within said end cap having a permanent electric field component in a direction transverse to the rotational axis of said end cap.

8. The end cap of claim 7 in which said polarized material is a porous polymeric electret film without electrodes.

9. The end cap of claim 7 in which said polarized material is comprised of multiple pieces of electret film symmetrically distributed and oriented such that their respective E fields add.

10. The end cap of claim 7, further characterized as being made of a non-magnetic, non-conductive material having yield strength greater than 20 MPa.

11. A method for use in an NMR MAS probe comprising a sample spinner rotatable about a rotational axis within a stator, the method comprising the steps of:

providing, in the sample spinner, a permanent electric field component in a direction transverse to the rotational axis of said spinner, rotating the sample spinner;

detecting by means of an antenna external to said sample spinner, a time-dependent electric field produced by the rotation of said electrically polarized material, whereby spin rate of the sample spinner is measured.

12. The method of claim 11 wherein the detecting step further comprises detecting a phase of the time-dependent electric field produced by the rotation of said electrically polarized material, whereby phase of the spinning of the sample spinner is measured.

* * * * *